United States Patent
Tsai et al.

(10) Patent No.: US 9,076,784 B2
(45) Date of Patent: *Jul. 7, 2015

(54) TRANSISTOR AND SEMICONDUCTOR STRUCTURE

(71) Applicant: UNITED MICROELECTRONICS CORP., Hsin-Chu (TW)

(72) Inventors: Min-Chuan Tsai, New Taipei (TW); Hsin-Fu Huang, Tainan (TW); Chi-Mao Hsu, Tainan (TW); Chin-Fu Lin, Tainan (TW); Chien-Hao Chen, Yunlin County (TW); Wei-Yu Chen, Tainan (TW); Chi-Yuan Sun, Yunlin County (TW); Ya-Hsueh Hsieh, Kaohsiung (TW); Tsun-Min Cheng, Changhua County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/454,727

(22) Filed: Aug. 8, 2014

(65) Prior Publication Data
US 2014/0346616 A1 Nov. 27, 2014

Related U.S. Application Data

(63) Continuation of application No. 13/495,009, filed on Jun. 13, 2012, now Pat. No. 8,836,049.

(51) Int. Cl.
*H01L 29/78* (2006.01)
*H01L 29/49* (2006.01)
*H01L 21/28* (2006.01)
*H01L 29/51* (2006.01)
(Continued)

(52) U.S. Cl.
CPC ...... *H01L 29/4966* (2013.01); *H01L 21/28088* (2013.01); *H01L 29/517* (2013.01); *H01L 29/66545* (2013.01); *H01L 21/823842* (2013.01); *H01L 21/823857* (2013.01); *H01L 2924/0002* (2013.01); *H01L 29/4958* (2013.01); *H01L 29/512* (2013.01); *H01L 29/78* (2013.01)

(58) Field of Classification Search
CPC ............ H01L 29/4966; H01L 29/4958; H01L 29/512; H01L 29/517; H01L 29/78; H01L 21/823842; H01L 21/823857; H01L 21/28088
USPC ............ 257/412, E29.16, E21.179; 438/592, 438/590
See application file for complete search history.

(56) References Cited

U.S. PATENT DOCUMENTS

| 5,892,282 A | 4/1999 | Hong |
| 6,077,772 A | 6/2000 | Park |
| 6,096,659 A | 8/2000 | Gardner |

(Continued)

OTHER PUBLICATIONS

Huang, Title of Invention: Metal Gate and Fabrication Method Thereof, U.S. Appl. No. 13/161,519, filed Jun. 16, 2011.

*Primary Examiner* — Tu-Tu Ho
(74) *Attorney, Agent, or Firm* — Winston Hsu; Scott Margo

(57) ABSTRACT

A semiconductor structure includes a work function metal layer, a (work function) metal oxide layer and a main electrode. The work function metal layer is located on a substrate. The (work function) metal oxide layer is located on the work function metal layer. The main electrode is located on the (work function) metal oxide layer. A semiconductor process forming said semiconductor structure is also provided.

5 Claims, 5 Drawing Sheets

(51) Int. Cl.
*H01L 29/66* (2006.01)
*H01L 21/8238* (2006.01)

(56) References Cited

U.S. PATENT DOCUMENTS

| | | | |
|---|---|---|---|
| 6,177,303 B1 | 1/2001 | Schmitz |
| 6,303,418 B1 | 10/2001 | Cha |
| 6,458,684 B1 | 10/2002 | Guo |
| 6,573,134 B2 | 6/2003 | Ma |
| 6,960,416 B2 | 11/2005 | Mui |
| 7,126,199 B2 | 10/2006 | Doczy |
| 7,144,783 B2 | 12/2006 | Datta |
| 7,148,548 B2 | 12/2006 | Doczy |
| 7,153,784 B2 | 12/2006 | Brask |
| 7,176,090 B2 | 2/2007 | Brask |
| 7,186,605 B2 | 3/2007 | Cheng |
| 7,208,361 B2 | 4/2007 | Shah |
| 7,217,611 B2 | 5/2007 | Kavalieros |
| 7,355,281 B2 | 4/2008 | Brask |
| 7,407,876 B2 | 8/2008 | Ishizaka |
| 7,556,998 B2 | 7/2009 | Park |
| 7,700,479 B2 | 4/2010 | Huang |
| 7,871,915 B2 | 1/2011 | Lim |
| 7,923,321 B2 | 4/2011 | Lai |
| 8,836,049 B2 * | 9/2014 | Tsai et al. | 257/412 |
| 2006/0024953 A1 | 2/2006 | Papa Rao |
| 2006/0079005 A1 | 4/2006 | Brask |
| 2007/0132003 A1 | 6/2007 | Takashima |
| 2007/0145591 A1 | 6/2007 | Yano |
| 2007/0259519 A1 | 11/2007 | Yang |
| 2007/0262451 A1 | 11/2007 | Rachmady |
| 2007/0272123 A1 | 11/2007 | Kennedy |
| 2008/0076216 A1 | 3/2008 | Pae |
| 2008/0224235 A1 | 9/2008 | Lavoie |
| 2009/0057769 A1 | 3/2009 | Wei |
| 2009/0186458 A1 | 7/2009 | Yu |
| 2010/0044783 A1 | 2/2010 | Chuang |
| 2010/0065926 A1 | 3/2010 | Yeh |
| 2010/0068877 A1 | 3/2010 | Yeh |
| 2010/0081262 A1 | 4/2010 | Lim |
| 2010/0087055 A1 | 4/2010 | Lai |
| 2010/0124818 A1 | 5/2010 | Lee |
| 2010/0216287 A1 | 8/2010 | Tsai |
| 2010/0244141 A1 | 9/2010 | Beyer |
| 2012/0001262 A1 | 1/2012 | Kang |
| 2012/0319179 A1 | 12/2012 | Huang |
| 2012/0322246 A1 | 12/2012 | Wang |
| 2013/0026578 A1 * | 1/2013 | Tsau | 257/368 |

* cited by examiner

TRANSISTOR AND SEMICONDUCTOR STRUCTURE

CROSS REFERENCE TO RELATED APPLICATIONS

This patent application is a continuation application and claims priority of U.S. patent application Ser. No. 13/495,009, filed on Jun. 13, 2012, and entitled "SEMICONDUCTOR STRUCTURE AND PROCESS THEREOF", the entire contents of which are incorporated herein by reference.

BACKGROUND OF THE INVENTION

1. Field of the Invention

The present invention relates generally to a transistor and a semiconductor structure, and more specifically to a transistor and a semiconductor structure that has a metal oxide layer on a work function metal layer.

2. Description of the Prior Art

Poly-silicon is conventionally used as a gate electrode in semiconductor devices such as metal-oxide-semiconductors (MOS). With the trend towards scaling down semiconductor devices, conventional poly-silicon gates face the problem of lower performance due to boron penetration and unavoidable depletion effect, which increases the equivalent thickness of the gate dielectric layer, reduces the gate capacitance, and worsens the driving force of the devices. Therefore, work function metals that are suitable to be used as high-K gate dielectric layers are employed to replace the conventional poly-silicon gate as the control electrode.

A method of forming a metal gate by replacing a conventional polysilicon gate with a work function metal includes: a sacrificial gate is formed on a substrate; a spacer is formed on the substrate beside the sacrificial gate; a source/drain region is formed and automatically aligned by using the spacer; an interdielectric layer is disposed and planarized on the substrate; the sacrificial gate is removed to form a recess, and then a work function metal layer, a barrier layer and aluminum are sequentially filled into the recess to form a metal gate.

As sizes of semiconductor components are reduced, material layers such as a barrier layer having a large enough thickness to prevent aluminum from diffusing downwards will be filled into the recess after the work function metal layer is filled. As part of the volume of the recess and the opening size of the recess are occupied, there will be a difficulty in filling the recess with aluminum. Furthermore, as the sizes of the semiconductor components are reduced, the volume and the exposed surface area of aluminum will also be reduced, so that the contact resistance between the aluminum and a contact plug formed above increases. As the semiconductor components are formed precisely, the electrical demand is critical. How to improve the work function values of the semiconductor components therefore becomes an important issue.

SUMMARY OF THE INVENTION

The present invention provides a transistor and a semiconductor structure, which has a metal oxide layer on a work function metal layer, to solve the above problems.

The present invention provides a semiconductor structure including a work function metal layer, a work function metal oxide layer and a main electrode. The work function metal layer is located on a substrate. The work function metal oxide layer is located on the work function metal layer. The main electrode is located on the work function metal oxide layer.

The present invention provides a semiconductor structure including a work function metal layer, a metal oxide layer and a main electrode. The work function metal layer is located on a substrate. The metal oxide layer is located on the work function metal layer. The main electrode is located on the metal oxide layer.

The present invention provides a semiconductor process including the following steps. A work function metal layer is formed on a substrate. A metal oxide layer is formed on the work function metal layer. A main electrode is formed on the metal oxide layer.

The present invention provides a semiconductor structure and a process thereof, which forms a metal oxide layer on a work function metal layer. This way, difficulties in filling recesses, reducing contact resistance between a contact plug and aluminum, and fine tuning of the work function values of metal gates can be improved, enhancing the performances of formed semiconductor components.

These and other objectives of the present invention will no doubt become obvious to those of ordinary skill in the art after reading the following detailed description of the preferred embodiment that is illustrated in the various figures and drawings.

DETAILED DESCRIPTION

The semiconductor process of the present invention can be applied to a gate-last for high-k first process or a gate-last for high-k last process etc., and is suitable to be applied in a single MOS transistor or a CMOS transistor. A planar MOS transistor having a metal gate is used as an example in the following, but the present invention can also be applied to a fin-shaped field effect transistor (FinFET) or a tri-gate MOSFET having a metal gate. A planar MOS transistor applying a gate-last for high-k first process is presented below, but the invention is not limited thereto.

Figure 1:
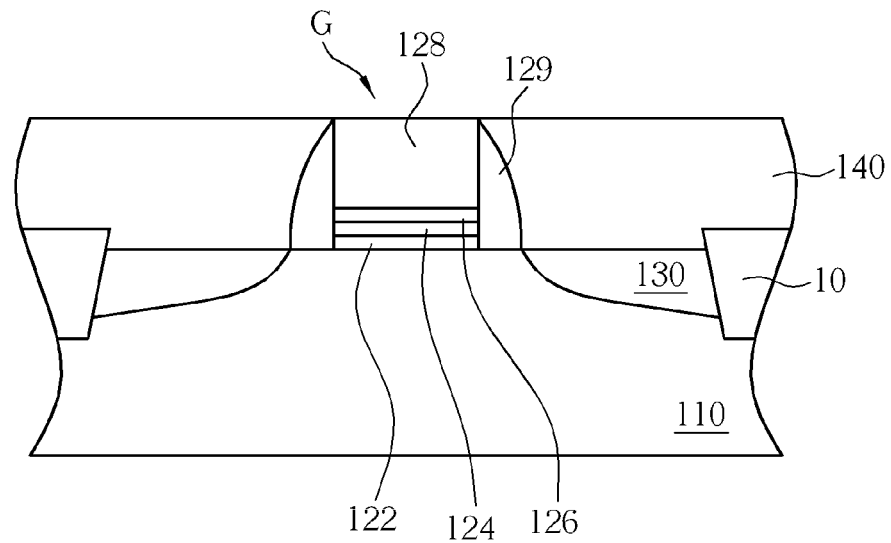
FIGS. 1-8 schematically depict cross-sectional views of a semiconductor process according to an embodiment of the present invention.

FIGS. 1-8 schematically depict cross-sectional views of a semiconductor process according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. An isolation structure 10 is formed in the substrate 110 to electrically isolate each transistor. The isolation structure 10 may be a shallow trench isolation (STI) structure, formed by a shallow trench isolation process, but it is not limited thereto. The method of forming the isolation structure is known in the art, and will therefore not be described herein.

A buffer layer (not shown), a gate dielectric layer (not shown), a barrier layer (not shown) and a sacrificial electrode layer (not shown) are sequentially formed from bottom to top to cover the substrate 110; the sacrificial electrode layer (not shown), the barrier layer (not shown), the gate dielectric layer (not shown) and the buffer layer (not shown) are patterned to form a buffer layer 122, a gate dielectric layer 124, a barrier layer 126 and a sacrificial electrode layer 128 on the substrate 110. A sacrificial gate G including the buffer layer 122, the gate dielectric layer 124, the barrier layer 126 and the sacrificial electrode layer 128 is now formed. In another embodiment, a cap layer (not shown) may be selectively formed on the top of the sacrificial gate G to be used as a hard mask for patterning.

The buffer layer 122 may be an oxide layer, formed by a thermal oxidation process or a chemical oxidation process, etc. The buffer layer 122 is located between the gate dielectric layer 124 and the substrate 110 to buffer the gate dielectric layer 124 and the substrate 110. A gate-last for high-k first process is applied in this embodiment, so that the gate dielectric layer 124 is a gate dielectric layer with a high dielectric constant, and may be the group selected from hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT), lead zirconate titanate (PbZrxTi1-xO3, PZT) and barium strontium titanate (BaxSr1-xTiO3, BST), but is not limited thereto. In another embodiment, as a gate-last for high-k last process is applied, the gate dielectric layer 124 will be removed in later processes and then a gate dielectric layer of a high dielectric constant is filled, so that the gate dielectric layer 124 can be a sacrificial material which is easy to remove in later processes. The barrier layer 126 is located on the gate dielectric layer 124 to act as an etch stop layer while the sacrificial electrode layer 128 is removed to protect the gate dielectric layer 124, and for preventing metals above from diffusing downwards and polluting the gate dielectric layer 124. The barrier layer 126 may be a single layer structure or a multilayer structure composed of tantalum nitride (TaN) or titanium nitride (TiN) etc. The sacrificial electrode layer 128 may be formed by polysilicon, but is not limited thereto.

A spacer 129 is formed on the substrate 110 next to the sacrificial gate G. An ion implantation process is performed to automatically align and form a source/drain region 130 in the substrate 110. The spacer 129 may be a single layer structure or a multilayer structure composed of silicon nitride or silicon oxide etc. A salicide process may be selectively performed to form a metal silicide (not shown) on the source/drain region 130; a contact etch stop layer (CESL) may be selectively formed to cover the substrate 110. An interdielectric layer (not shown) is formed to cover the substrate 110 and the sacrificial gate G, and then the interdielectric layer (not shown) is planarized to form an interdielectric layer 140 and expose the sacrificial electrode layer 128.

Figure 2:
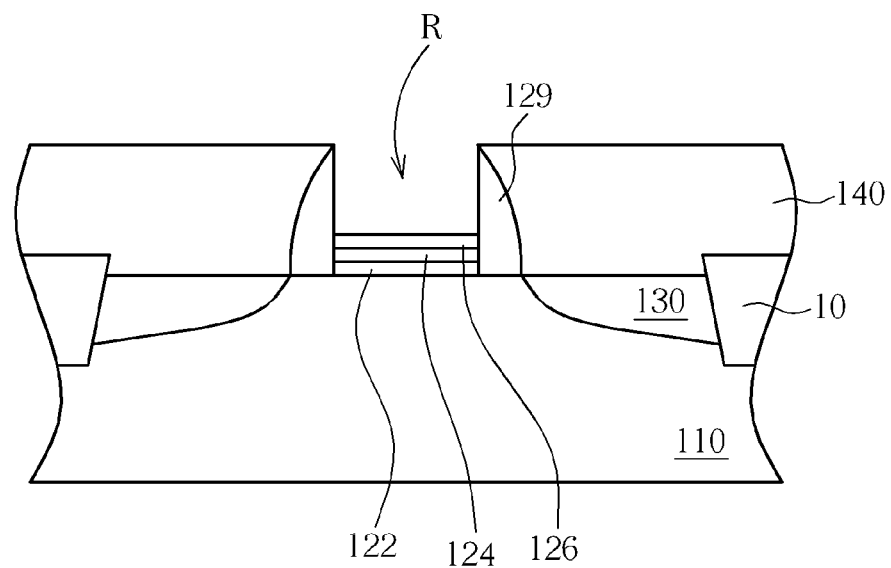
Figure 3:
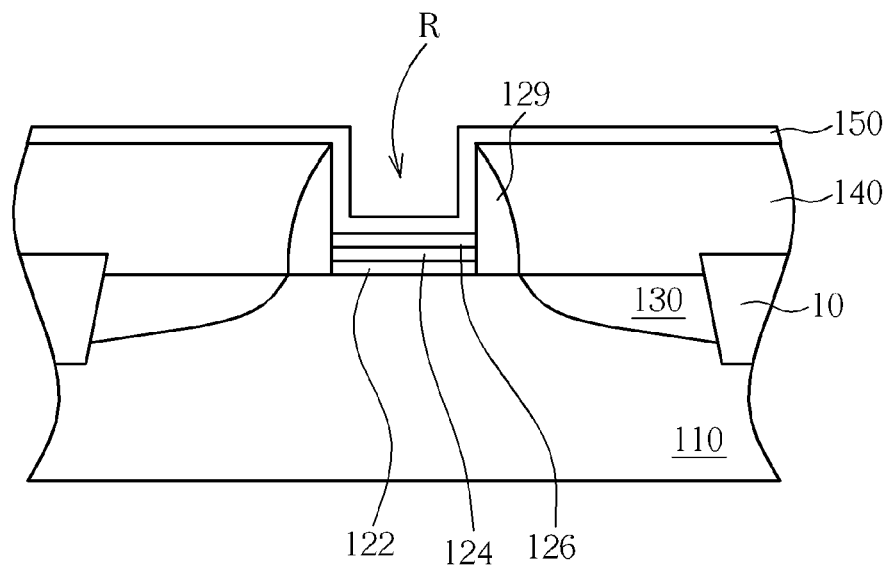

The sacrificial electrode layer 128 is removed by a method such as etching. As shown in FIG. 2, a recess R is formed and the barrier layer 126 is exposed. As shown in FIG. 3, a work function metal layer 150 is formed to fully cover the recess R and the interdielectric layer 140. In one case, the work function metal layer 150 may be a single layer or a multilayer structure, composed of titanium nitride (TiN), titanium carbide (TiC), tantalum nitride (TaN), tantalum carbide (TaC), tungsten carbide (WC), titanium aluminide (TiAl) or aluminum titanium nitride (TiAlN). For example, the work function metal layer 150 may be a titanium nitride layer suitable for forming a PMOS transistor (the work function value is within the range 4.8 eV~5.2 eV). In this embodiment, the work function metal layer 150 is a titanium aluminide layer suitable for forming an NMOS transistor (the work function value is within the range 3.9 eV~4.3 eV).

Figure 4:
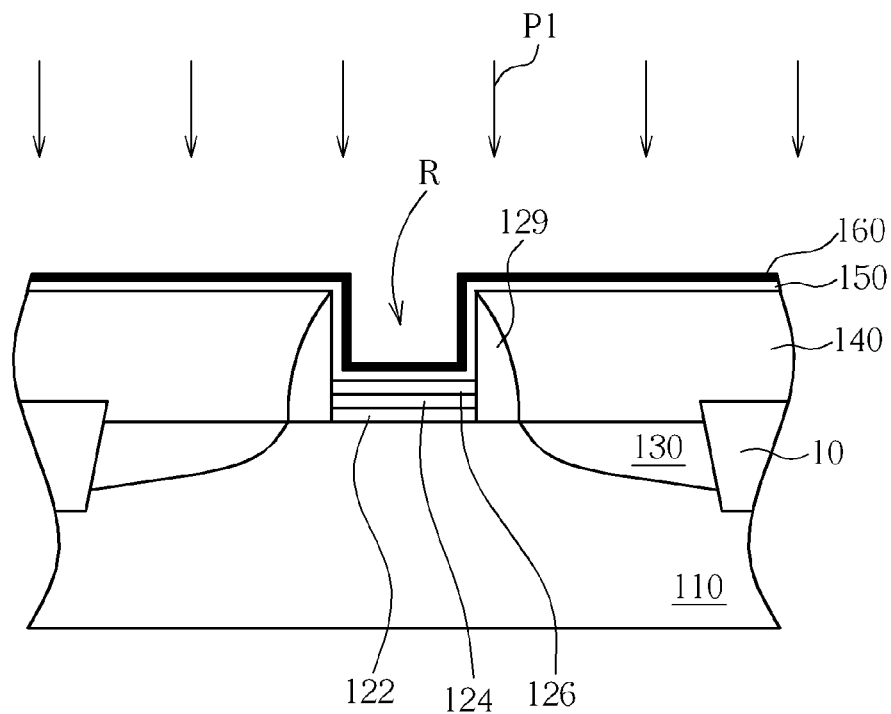

As shown in FIG. 4, a metal oxide layer 160 is formed on the work function metal layer 150 to prevent metals formed in later processes from diffusing downward. In this embodiment, the metal oxide layer 160 is obtained by performing an oxidation process P1 to oxidize the surface of the work function metal layer 150, therefore the metal oxide layer 160 is a work function metal oxide layer of the work function metal layer 150, but is not limited thereto. Specifically, the work function metal layer 150 may be deposited in a processing chamber, and then the work function metal layer 150 is exposed to the air, enabling the surface of the work function metal layer 150 to oxidize to form the metal oxide layer 160. In another embodiment, the metal oxide layer 160 may be obtained by importing oxygen, ozone or vapor, etc. into the chamber, or the metal oxide layer 160 may be obtained by being exposed to an environment having these gases. The thickness of the metal oxide layer 160 can be controlled according to the exposure time of the work function metal layer 150 to the air, the exposure time of the work function metal layer 150 to the environment having these gases or the concentration of these gases, or the time to import these gases or the concentration of these imported gases. Since the work function metal layer 150 is a titanium aluminide layer, the metal oxide layer 160 is an aluminum titanium oxide layer oxidized by the work function metal layer 150. The chemical formula of the aluminum titanium oxide layer includes $Ti_xAl_yO_z$, with x, y, z larger than zero, and the ratio of x, y, z depends upon the concentration of the gases such as oxygen, ozone or vapor. In an embodiment, the chemical formula of the aluminum titanium oxide layer is TiAlO, but it is not limited thereto.

Figure 5:
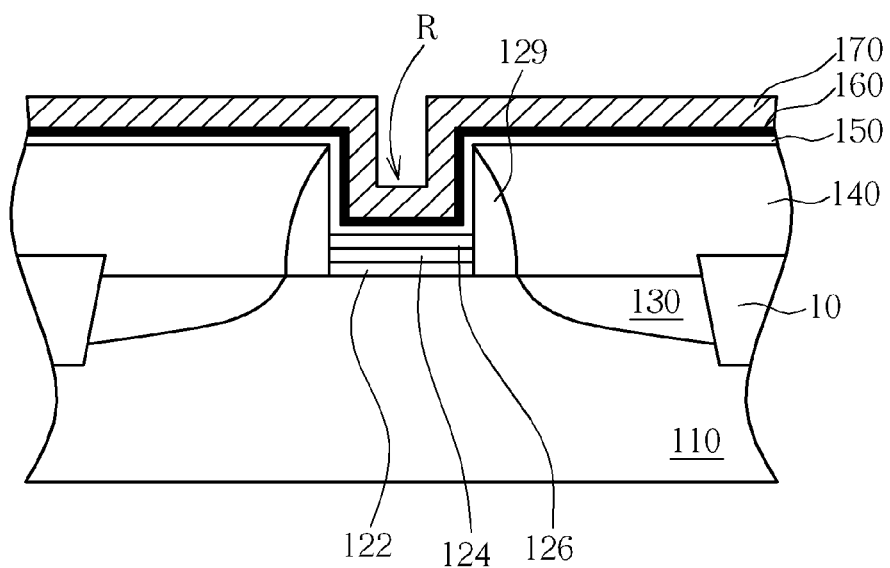
Figure 6:
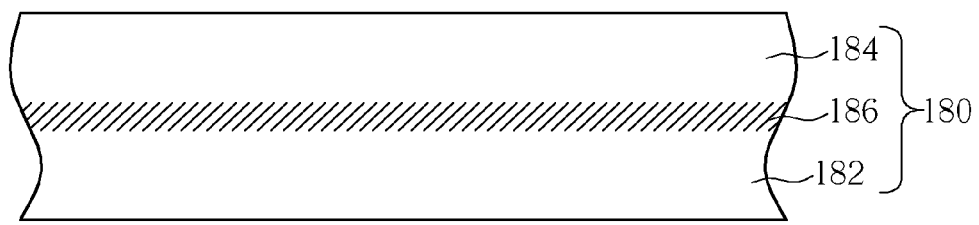

As shown in FIG. 5, a barrier-wetting layer 170 is formed on the metal oxide layer 160. The barrier-wetting layer 170 has the properties of a barrier layer and a wetting layer. The barrier-wetting layer 170 can prevent metals formed in later processes, such as aluminum, from diffusing downward and enhancing the attaching properties of the metals without voids being generated, which decreases the equivalent resistance of the formed semiconductor component. For instance, the barrier-wetting layer 170 may be formed in-situ. In this embodiment, the barrier-wetting layer 170 is a titanium nitride/titanium layer (the bottom layer is a titanium nitride layer and the top layer is a titanium layer), wherein the forming method may include the following steps. Nitrogen gas is imported while titanium is sputtered to form the titanium nitride layer, and then stops the supply of the nitrogen gas while titanium is sputtered to form the titanium layer. As shown in FIG. 6, the structure of the titanium nitride/titanium layer 180 formed in-situ includes a titanium nitride layer 182, a titanium layer 184 and a transition layer 186 between the titanium nitride layer 182 and the titanium layer 184, wherein the titanium nitride layer 182 has the properties of a barrier layer while the titanium layer 184 has wetting properties. The barrier-wetting layer 170 of the present invention formed in-situ can reduce the total thickness of a barrier layer and a wetting layer compared to forming a barrier layer and a wetting layer individually as in current semiconductor processes.

The barrier-wetting layer 170 may be a titanium/titanium nitride/titanium layer (the bottom layer is a titanium layer, the middle layer is a titanium nitride layer and the top layer is a titanium layer), wherein the forming method may include the following steps. The titanium layer is formed; a nitridation process such as a nitrogen gas importing process or treatment is performed to form the titanium nitride layer by transforming the top surface of the titanium layer; and then, the titanium layer is formed in-situ on the titanium nitride layer.

Figure 7:
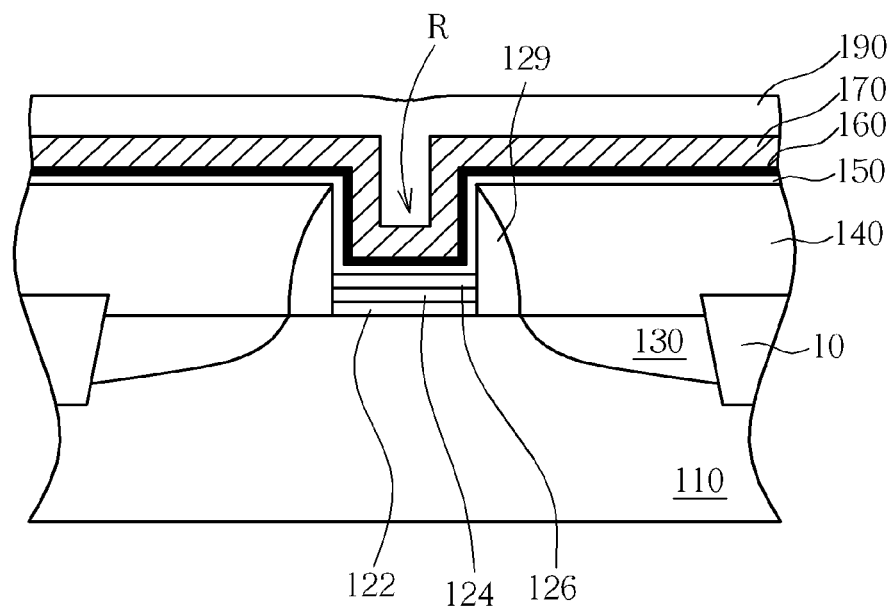
Figure 8:
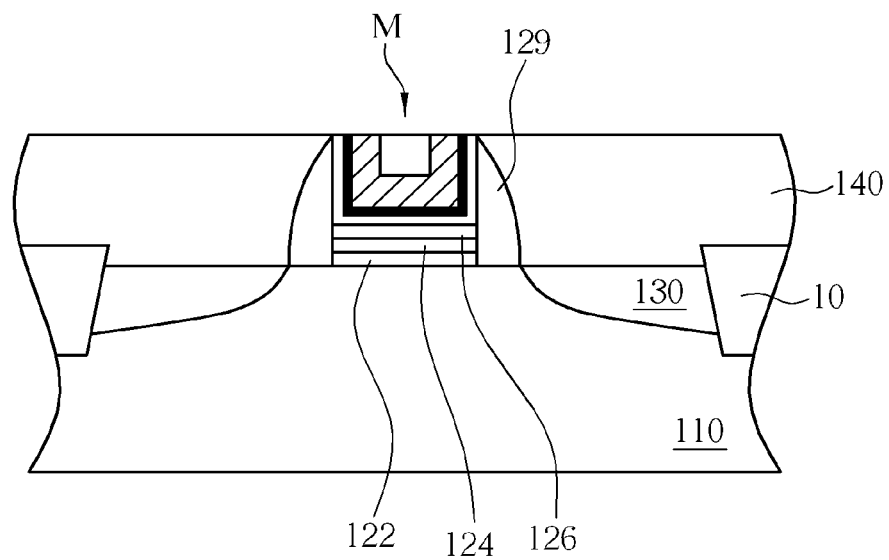

As shown in FIG. 7, a main electrode 190 is formed on the barrier-wetting layer 170, and fills the recess R. In this embodiment, the main electrode 190 is composed of aluminum. In another embodiment, the main electrode 190 may be low resistance materials composed of tungsten, titanium aluminum (TiAl) alloy, or cobalt tungsten phosphide (CoWP) etc. Then, the main electrode 190, the barrier-wetting layer 170, the metal oxide layer 160 and the work function metal layer 150 are planarized, meaning that a metal gate M is now formed, as shown in FIG. 8.

It is emphasized that the metal oxide layer 160 is formed on the work function metal layer 150 so as to prevent metals formed above the metal oxide layer 160 such as the main electrode 190 from diffusing downward to the work function metal layer 150, thereby reducing the leakage current density (Jg). More precisely, the metal oxide layer 160 of the present invention is obtained by oxidizing the work function metal layer 150, so that there are no other layers formed on the work function metal layer 150 which occupies space for the barrier-wetting layer 170 and the main electrode 190 formed therein. Moreover, forming the metal oxide layer 160 can reduce the thickness of the work function metal layer 150. For example, as the work function metal layer 150 is a titanium aluminum layer and the metal oxide layer 160 is a titanium aluminum oxide layer, the thickness of the titanium aluminum layer can be reduced from 100 angstroms to 30 angstroms and the desired leakage current density (Jg) can still be achieved. Furthermore, as the method of forming the metal oxide layer 160 is paired with the method of forming the barrier-wetting layer 170, the thickness of the barrier-wetting layer 170 can be reduced thanks to the metal oxide layer 160 having already prevented metals from diffusing downward. The present invention can prevent metals such as the main electrode 190 from diffusing downward and can increase the space into which the metals are filled, so that difficulties in filling recesses can be avoided. Furthermore, due to the increase of the volume of the metals and the increase of the contact area between the metals such as aluminum and a contact plug (not shown) formed thereon, the contact plug (not shown) can be distanced away from the barrier-wetting layer 170, further decreasing the contact resistance. Specifically, compared to current semiconductor processes that form a barrier layer with a thickness of 40 angstroms and then form a wetting layer with a thickness of 120 angstroms ex-situ, the present invention can provide the barrier-wetting layer 170 with a thickness of 90 angstroms to achieve the same purpose, wherein the titanium nitride layer 182 has a thickness of 40 angstroms and the titanium layer 184 has a thickness of 50 angstroms, and the transition layer 186 is self-reacted and formed by both.

Figure 9:
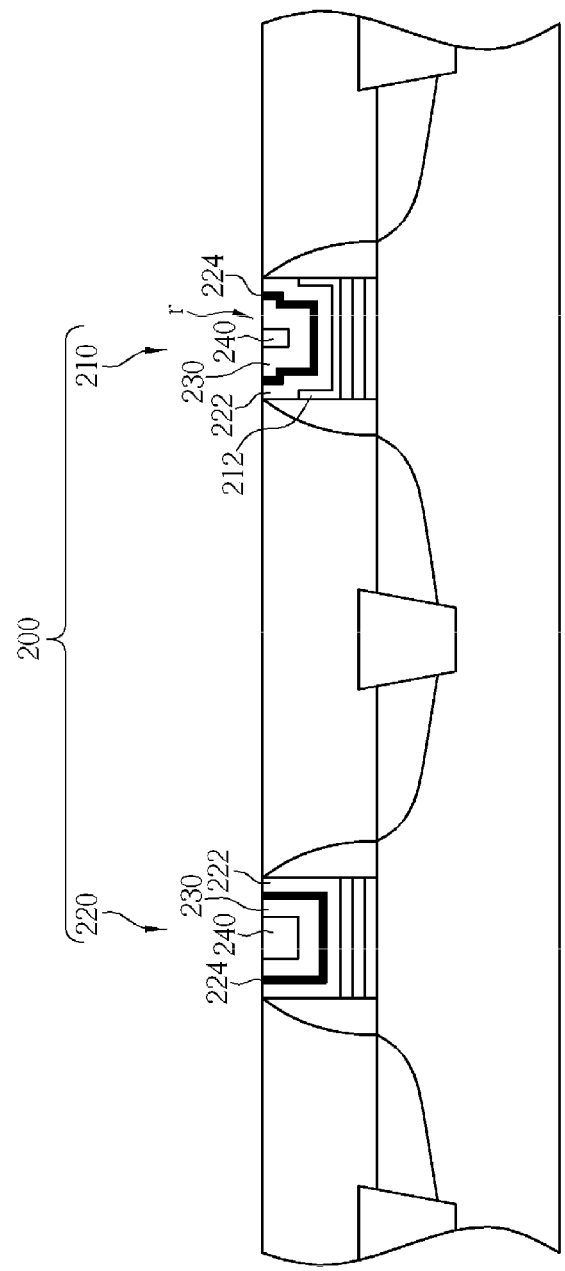
FIG. 9 schematically depicts a cross-sectional view of a CMOS transistor according to an embodiment of the present invention.

Because of these advantages, the present invention plays a more important role when applied to a CMOS transistor. FIG. 9 schematically depicts a cross-sectional view of a CMOS transistor according to an embodiment of the present invention. A CMOS transistor 200 includes a PMOS transistor 210 and an NMOS transistor 220. During processes, a work function metal layer 212 suitable for being used in a PMOS transistor such as a titanium nitride layer is formed in the PMOS transistor 210, and then a work function metal layer 222 suitable for being used in an NMOS transistor such as a titanium aluminide layer is formed in the PMOS transistor 210 and the NMOS transistor 220. Little space remains in a recess r of the PMOS transistor 210 due to the presence of the work function metal layer 212 and 222 in the PMOS transistor 210. The semiconductor process of the present invention can solve this problem. As shown in FIG. 9, a metal oxide layer 224 is formed on the work function metal layer 222 by applying the semiconductor process of the present invention. Then, a barrier-wetting layer 230 is formed on the metal oxide layer 224. A main electrode 240 is filled into the recess r. The CMOS transistor process is known in the art; the way of the semiconductor process is applied to a CMOS transistor 200 is similar to the way the semiconductor process is applied to a single MOS transistor, and will therefore not be described herein.

The method of forming the metal oxide layer 160/224 on the work function metal layer 150/222 and forming the barrier-wetting layer 170/230 can be adjusted during the processes so as to adjust the thickness of the metal oxide layer 160/224 and the barrier-wetting layer 170/230, and accordingly adjust the work function value of formed metal gate M. The performance of formed semiconductor component can thereby be improved.

To summarize, the present invention provides a semiconductor structure and a process thereof, which forms a metal oxide layer on a work function metal layer and then forms a barrier-wetting layer on the metal oxide layer. The metal oxide layer of the present invention can prevent metals, such as the main electrode, from diffusing downward to the work function metal layer, thereby reducing a leakage current density (Jg). Moreover, as the metal oxide layer is paired with the barrier-wetting layer, not only can metals above the barrier-wetting layer be prevented from diffusing downward, but also the space where the metals are filled into will increase. Thus, difficulties in filling recesses, a reduction of contact resistance between a contact plug (not shown) and aluminum, and fine tuning of the work function value of the metal gate can be improved, enhancing the performance of formed semiconductor components.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transistor, comprising:
   a source;
   a drain; and
   a metal gate comprising:
      a work function metal layer located on a substrate, the work function metal layer comprising titanium aluminide, regardless of whether the transistor is a PMOS transistor or a NMOS transistor;
      a work function metal oxide layer located on the work function metal layer;
      a barrier-wetting layer located on the work function metal oxide layer; and
      a main electrode located on the barrier-wetting layer.

2. The transistor according to claim 1, wherein the work function metal oxide layer comprises an aluminum titanium oxide layer.

3. The transistor according to claim 1, wherein the main electrode comprises aluminum.

4. The transistor according to claim 1, wherein the barrier-wetting layer comprises a titanium nitride/titanium layer.

5. The transistor according to claim 1, wherein the barrier-wetting layer comprises a titanium/titanium nitride/titanium layer.

* * * * *